United States Patent [19]

Jeanmonod

[11] Patent Number: 4,744,329

[45] Date of Patent: May 17, 1988

[54] PROCESS FOR THE COATING OF PENCILS AND APPARATUS FOR THE PRACTICE OF THIS PROCESS

[75] Inventor: Charles Jeanmonod, Thonex, Switzerland

[73] Assignee: Caran d'Ache S.A., Thonex, Switzerland

[21] Appl. No.: 869,016

[22] Filed: May 28, 1986

[30] Foreign Application Priority Data

Jun. 5, 1985 [CH] Switzerland .......................... 02381/85

[51] Int. Cl.[4] .......................... C23C 14/00; B05D 3/06

[52] U.S. Cl. .................................. 118/50.1; 118/620; 427/44

[58] Field of Search ................. 427/36, 44, 54 L, 359, 427/434.7; 118/405, 404, 419, 420, 27, 65, 54.1, 620, 78, 109; 250/492.1

[56] References Cited

U.S. PATENT DOCUMENTS

| | | | |
|---|---|---|---|
| 2,760,229 | 8/1956 | Cheney et al. | 118/424 |
| 2,790,202 | 4/1957 | Lorenian | 264/172 |
| 3,081,485 | 3/1963 | Steigerwald | 250/492.3 |
| 4,048,504 | 9/1977 | Bosshard | 250/492.3 |
| 4,125,644 | 11/1978 | Ketley et al. | 427/36 |
| 4,637,952 | 1/1987 | Rosenlund | 118/429 |

FOREIGN PATENT DOCUMENTS

| | | |
|---|---|---|
| 55-127174 | 10/1980 | Japan . |
| 58-101765 | 6/1983 | Japan . |
| 2137118 | 10/1984 | United Kingdom . |

*Primary Examiner*—Thurman K. Page
*Attorney, Agent, or Firm*—Young & Thompson

[57] ABSTRACT

The process for coating pencils comprises the treatment by accelerated electrons of pencils provided with a layer of polymerizable resin, in which the pencils are introduced into a chamber under inert atmosphere in which they fall freely while passing through streams of accelerated electrons.

The apparatus for the practice of this process comprises especially a drying device for the resin constituted by a closed chamber (6) containing two electron guns (7, 7') and having an inlet opening (8) in its upper wall for the introduction of the pencils and an outlet opening (9) in its bottom for the evacuation toward the exterior of the treated pencils; the introduction opening and the outlet opening are disposed vertically the one under the other in such a manner that the pencils can pass from the one to the other through a vertical free fall.

4 Claims, 1 Drawing Sheet

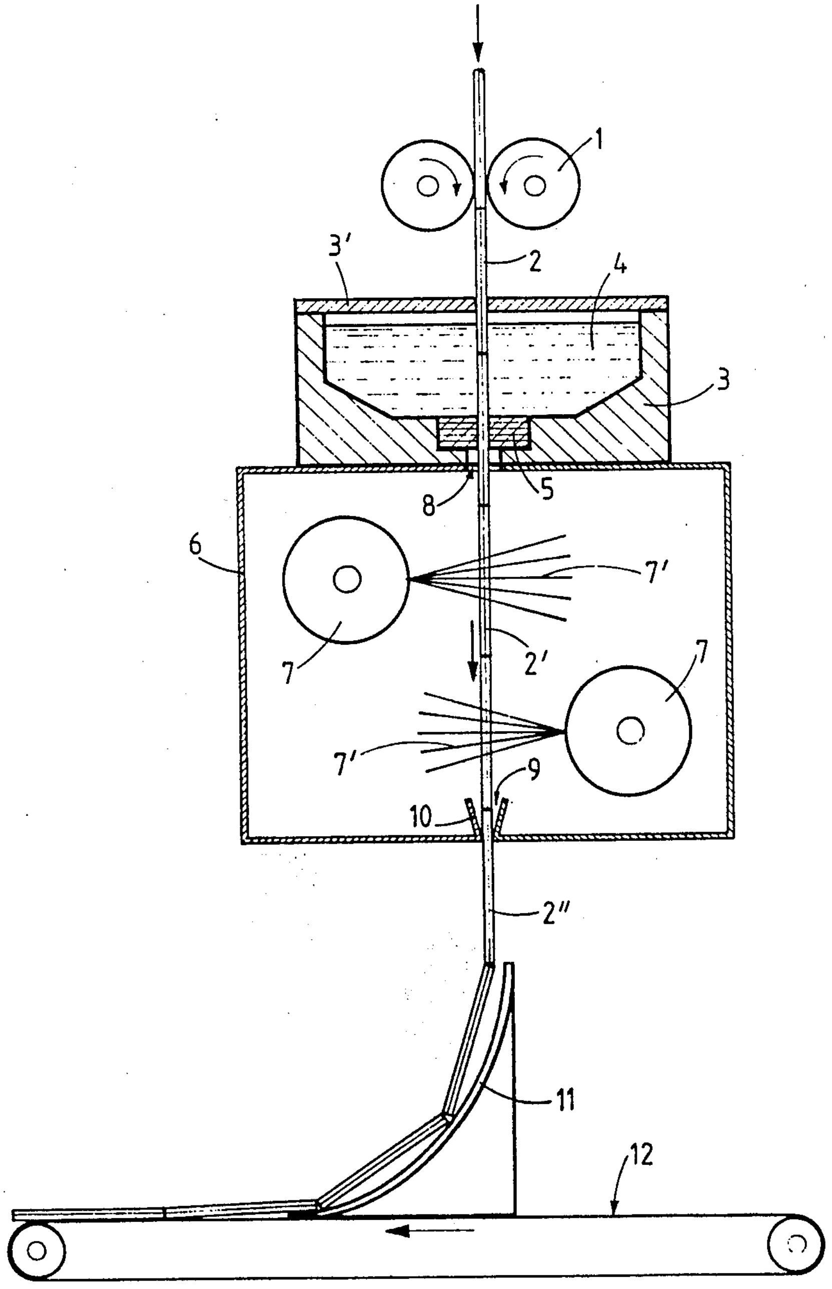
1
2
3'
4
3
8
5
6
7'
7
2'
7
7'
10
9
2"
11
12

PROCESS FOR THE COATING OF PENCILS AND APPARATUS FOR THE PRACTICE OF THIS PROCESS

The present invention relates to a process for the coating of pencils with treatment by accelerated electrons of a polymerizable resin layer, as well as to an apparatus for the practice of this process, which comprises means for the supply and the evacuation of the pencils, a device for coating the pencils with a polymerizable resin and a drying device of this resin with electron guns.

In the industrial manufacture of pencils, the pencils are generally subjected to a finishing operation which consists in applying thereon a simultaneously protecting and decorative coating. This coating can be constituted by a varnish which is applied to the surface of the wood of the pencils from a bath containing a mixture of varnishes and a solvent, than dried by passage through furnaces, or by a polymerizable resin which is hardened and dried after applying on the wood of the pencils by a treatment with accelerated electrons.

This latter technique is now prefered, and its practice is carried out with plants of the precited type. In these known plants, the pencils are supplied to the various treatment stations for example in a layer or sheet or the ones behind the others and driven in a continuous advance movement by a transfer chain. In order to obtain a better efficiency of the hardening treatment of the resin by accelerated electrons, the pencils can be further subjected in the beam of the electron gun to a movement of rotation on themselves, or can be disposed on a rotative mandrel.

However, the known apparatuses as described above have the drawback of necessitating that the pencils should always be maintained by mechanical means in contact with the resin to be dried, or laid on a surface, this hindering to obtain a uniform and homogeneous coating on the whole of the surface of the pencils.

The purpose of this invention consists consequently in providing a process and an apparatus of the precited type, which do not have the drawbacks thereof.

The first object of this invention thus consists in providing a process for the coating of pencils, which is characterized by the fact that the pencils are introduced in a chamber under inert atmosphere in which they freely fall through accelerated electron streams.

A second object of this invention is the provision an apparatus for the practice of the above process, which is characterized by the fact that the drying device comprises a closed chamber containing the electron guns and has an inlet opening in its upper wall for the introduction of the pencils and an outlet opening in its bottom for the evacuation towards the exterior of the treated pencils, the inlet opening and the outlet opening being disposed vertically the one under the other, in such a manner that the pencils can pass from one to the other by a free vertical fall.

The annexed drawing shows schematically and by way of example one embodiment of the apparatus according to the invention.

This apparatus comprises at its upper end driving wheels 1, driven by an electrical motor and intended to serve as supplying means of the pencils 2, in a row, and vertically downwards, more particularly in such a manner as to introduce them into a coating device, this at a speed of for example about 1 m/sec. The pencils 2 thus move vertically downwards, the ones following the others and in several rows. This device comprises a container 3 closed by a cover 3' presenting an inlet opening for the pencils 2, and containing a liquid composition 4 of a polymerizable resin.

The composition of the resin 4 can be constituted for example by a mixture of monomer and oligomer or prepolymer, which latter which can be for example of the acrylic, epoxy, polyester, urethane, polyene-polythiol, etc. type; the mixture further preferably contains a charge, pigments and other usual additives. The choice of the composition of the appropriate polymerizable resin is within the knowledge of those skilled in the art. The bottom of the container 3 has an opening provided with a seal 5 made of rubber, plastic or of any other appropriate material, acting like a spinning nozzle and serving to uniformly apply the resin 4 on the external surface of the pencils 2, after the passage thereof vertically through the resin bath 4. The outlet opening 5 is disposed vertically under the inlet opening provided in the cover 3'.

The coating device with "spinning nozzle" is disposed directly above a closed chamber 6, which is under inert atmosphere, for example of nitrogen, and containing here two electron guns 7. The upper wall of this chamber 6 is provided with an opening 8 into which the opening of the nozzle 5 of the coating device 3 directly opens, and which serves as the introduction opening of the pencils 2', now coated with the polymerizable resin (layer of about 20 to 300 μ), into the drying chamber.

In this chamber, the pencils 2' freely vertically fall in free fall under the action of gravity while passing through the streams 7' of accelerated electrons emitted by the guns or electron beam accelerators 7 disposed on each side of the passage of the pencils 2' and vertically offset from each other. By way of example, each electron gun or electron beam accelerator can be of an appropriate type to provide an electron beam of 150 to 180 KeV with a maximum current of 100 mA; in this case, a coating of a resin of the polyester type with an acrylic monomer having a thickness of about 30 microns is polymerized and hardened within about 0.5 to 1 sec.

The bottom of the container 6 has an outlet opening 9 surrounded by a funnel 10 intended to receive the pencils 2' after their fall and to guide them towards the exterior; this outlet opening 9 is disposed vertically under the introduction opening 8. A deflector element 11 is disposed under the drying chamber 6, and is intended to tip up the pencils 2" provided with their hardened and dried coating from the vertical position to the horizontal position, so they can be then received by an evacuation device, for example constituted by an endless belt conveyor 12.

Thus, thanks to the apparatus according to the invention, it is possible to proceed on an industrial scale with the coating of pencils in a rapid (some seconds) and economical (the process is carried out at room temperature) manner; furthermore, thanks to the fact that the pencils are moving vertically the one following the others, in several rows, by falling under the action of their own weight, that is without being maintained by mechanical means or in contact with a support surface, the coating obtained is perfectly uniform and homogeneous. Furthermore, the plant is simplified and the construction and maintenance costs are decreased.

What is claimed is:

1. A process for coating pencils, comprising pushing separate pencils individually downwardly through a bath of polymerizable resin and through the bottom of the bath further downwardly directly into a closed chamber containing an inert atmosphere, thereby to apply a coating of polymerizable resin to the pencils, letting the pencils fall freely through the closed chamber while subjecting them to streams of accelerated electrons to polymerize the resin coating on the pencils, and then directing the pencils through an outlet opening in the bottom of the chamber.

2. A method as claimed in claim 1, and arranging said streams of electrons as vertically superposed streams arranged in opposite directions from each other.

3. Apparatus for coating pencils, comprising means for pushing separate pencils individually downwardly through a bath of polymerizable resin and through the bottom of the bath further downwardly directly into a closed chamber containing an inert atmosphere, thereby to apply a coating of polymerizable resin to the pencils which then fall freely through the closed chamber, means in the chamber for subjecting the pencils to streams of accelerated electrons to polymerize the resin coating on the pencils, and means for directing the pencils through an outlet opening in the bottom of the chamber, said stream of electrons comprising vertically superposed streams arranged in opposite directions from each other.

4. Apparatus as claimed in claim 3, said directing means comprising a funnel.

* * * * *